United States Patent [19]

Uchiyama

[11] 3,973,223

[45] Aug. 3, 1976

[54] FREQUENCY-DEVIATION METHOD AND APPARATUS

[75] Inventor: Yasuji Uchiyama, Hamakita, Japan

[73] Assignee: Nippon Gakki Seizo Kabushiki Kaisha, Japan

[22] Filed: May 5, 1975

[21] Appl. No.: 574,681

Related U.S. Application Data

[63] Continuation of Ser. No. 81,011, Oct. 15, 1970, abandoned.

[30] Foreign Application Priority Data

| | | |
|---|---|---|
| Oct. 15, 1969 | Japan | 44-82412 |
| Oct. 15, 1969 | Japan | 44-82415 |
| Oct. 16, 1969 | Japan | 44-98574[U] |
| Oct. 16, 1969 | Japan | 44-98575[U] |
| Oct. 17, 1969 | Japan | 44-98804[U] |
| Oct. 15, 1969 | Japan | 44-82413 |
| Oct. 15, 1969 | Japan | 44-82414 |

[52] U.S. Cl. .................................... 332/44; 84/1.25; 332/31 T

[51] Int. Cl.[2] ........................ G10H 1/04; H03C 1/52

[58] Field of Search .................. 332/31 R, 31 T, 44, 332/45; 84/1.25

[56] References Cited

UNITED STATES PATENTS

| | | | |
|---|---|---|---|
| 3,493,669 | 2/1970 | Elbrecht et al. | 84/1.25 X |
| 3,510,567 | 5/1970 | Fisher | 332/31 T X |

*Primary Examiner*—Siegfried H. Grimm
*Attorney, Agent, or Firm*—Holman & Stern

[57] ABSTRACT

A carrier wave having a sub-audible frequency is modulated in amplitude by a modulating wave of a tone signal having an audible frequency, which produces a resultant modulated output signal having first and second side band components respectively deviated above and below the tone signal frequency by a deviation amount equal to the carrier frequency. The frequency of the carrier wave is much lower than that of the modulating wave. This frequency deviation technique is utilized to provide a tremolo effect or a chorus effect in an electronic musical instrument, wherein the frequency-deviated signal is admixed with the original non-deviated signal.

2 Claims, 47 Drawing Figures

INVENTOR

BY

ATTORNEY

INVENTOR

BY

ATTORNEY

INVENTOR

BY

ATTORNEY

INVENTOR

BY

ATTORNEY

INVENTOR

BY

ATTORNEY

INVENTOR

BY

ATTORNEY

INVENTOR

BY

ATTORNEY

INVENTOR

BY

ATTORNEY

INVENTOR

BY

ATTORNEY

FREQUENCY-DEVIATION METHOD AND APPARATUS

This is a continuation of application Ser. No. 81,011 filed Oct. 15, 1970 and now abandoned.

BACKGROUND OF THE INVENTION

This invention relates generally to electronic musical instruments and more particularly to techniques in frequency deviation and in generating tremolo effects. More specifically, the invention relates to a new and advanced frequency-deviation method wherein the frequencies of specific signals such as voice signals or musical tone signals are caused to deviate slightly up and down and to a new method and apparatus for utilizing this frequency-deviation method to generate tremolo-effect signals.

One example of a method known heretofore whereby the frequency of a specific signal as, for example, a musical-tone signal, is caused to deviate slightly is that wherein (as indicated in FIG. 1 described hereinafter) a carrier signal $f_{01}$ (e.g., 50 KHz) from an oscillator $\mathbf{0_1}$ of a frequency amply higher than that of the musical-tone signal (the signal usually comprises a plurality of frequency components thus constituting a frequency spectrum band, but for convenience in explanation in this specification, the spectrum band is represented by only a single frequency $f$) is subjected to balanced modulation by the musical-tone signal $f$ in a balanced modulator M. The resulting double-side band (or both-side band) signal having frequency components of $f_{01} - f$ and $f_{01} + f$ is demodulated in a demodulator D through the use of a signal $f_{02}$ of a frequency slightly higher (or lower) by $\Delta f$ (for example, from 1 to 10Hz) than the above mentioned signal $f_{01}$, the signal $f_{02}$ being obtained from a second oscillator $O_2$, whereupon a signal $f-\Delta f$ and a signal $f+\Delta f$ are produced as the demodulated output.

However, this known method requires a balanced modulator, a demodulator, and two oscillators, whereby the organization is complicated. Moreover, in the case where $\Delta f$ is made small, an extremely high degree of frequency stability of both oscillators becomes necessary. For this purpose, oscillators of high precision are required and entail high cost.

Furthermore, the only tremolo devices of electronic musical instruments which have heretofore been reduced to practice are those in which musical-tone signals are subjected to amplitude modulation with a specific period and waveform, and in which electrical signals are converted into audible signals at a loudspeaker, during which operation, by a method such as rotating the loudspeaker with a specific period, a tremolo effect or a chorus effect (the result of modulated frequencies of from 5 to 10 Hz being ordinarily referred to as a tremolo effect, and that of modulated frequencies of from 0.5 to 2 Hz being ordinarily referred to as a chorus effect in electronic musical instruments) is obtained.

In the former method, however, since only amplitude modulation is resorted to, the frequency of the musical tone does not vary, and the tone is monotonous, whereby the resulting effect is extremely weak. In the latter method, a Doppler effect is produced by the rotation of the loudspeaker, and there are variations in the frequency, phase, and directivity of the musical-tone signal. Furthermore, variation in the signal level (amplitude modulation) is added and imparts a swelling to the sound, whereby the result is highly effective. On the other hand, however, the device for rotating the loudspeaker and the driving mechanism therefor is unavoidably complicated and expensive, and, furthermore, objectionable noises such as mechanical noises and the sound of rotating parts such as the loudspeaker traveling through the air are produced.

SUMMARY OF THE INVENTION

It is therefore an object of the present invention to provide a frequency-deviation method and apparatus which are simple and inexpensive and, moreover, result in a stable operation, and which are based on a principle differing fundamentally from those of known techniques, that is, the principle whereby a sub-audio-frequency (ultra-low-frequency) signal is amplitude modulated with a musical-tone signal of a higher frequency.

A second object of the invention is to provide a frequency-deviation technique which comprises passing a modulating signal through a phase-difference, channel-separation filter (hereinafter referred to as a "phase separator") thereby to obtain two modulating signals mutually having a 90° phase difference, obtaining signals similarly having a 90° phase difference as signals to be modulated of sub-audible frequencies, applying appropriate combinations of the modulating signals and signals to be modulated to respective amplitude modulators thereby to accomplish amplitude modulation thereof and obtain double-side band signals, mixing the resulting amplitude modulation outputs, and removing one of the side-bands thereby to produce signals whose frequencies are deviated above or below from those of the modulating signals by differences equal to the sub-audible frequencies of the signals to be modulated.

A third object of the invention is to provide a simple and inexpensive technique for generating tremolo effects by which tremolo effects wherein amplitude variations accompany frequency variations are obtained in a purely electrical manner and, at the same time, to provide apparatus for this purpose which is simple, inexpensive, and superior to those known heretofore.

A fourth object of the invention is to provide a technique for generating tremolo effects by which tremolo effects wherein amplitude variations accompany frequency variations are obtained in a purely electrical manner, and, at the same time, a polyphonic effect as though from a plurality of tone-generator systems is obtained with a single tone-generator system.

A fifth object of the invention is to provide apparatus for generating tremolo effects by appropriately forming combinations of two musical-tone (modulating) signals differing in phase by 90° and two signals to be modulated of a frequency amply lower than that of the musical-tone signals and differing in phase by 90°, subjecting each resulting combination to amplitude modulation, adding together the resulting modulated outputs to produce a single-side-band signal, audibly rendering this signal and the original musical-tone signals separately, and producing a tremolo effect by spatial sound mixing.

A sixth object of the invention is to provide apparatus for generating tremolo effects by selectively forming combinations of two musical-tone (modulating) signals differing in phase by 90° and two signals to be modulated of a frequency amply lower than that of the musical-tone signals and differing in phase by 90°, subjecting each resulting combination to amplitude modulation, adding together the resulting modulated outputs to produce a single-side-band signal, mixing this signal and the original musical-tone signal, audibly rendering the resulting mixture signal and the original musical-tone signal separately, and producing a tremolo effect by spatial sound mixing.

A seventh object of the invention is to provide apparatus for generating tremolo effects by selecting combinations of two musical-tone modulating signals differing in phase by substantially 90° and two signals to be modulated of a frequency amply lower than that of the musical-tone modulating signals, subjecting the resulting combinations to amplitude modulation, adding together the resulting signals to produce upper-side-band and lower-side-band signals, and mixing these signals at respectively different amplitude levels with the original musical-tone signals thereby to produce electrically a tremolo effect.

The manner in which the objects of invention are achieved, as well as the nature, principle, and utility of the invention will be more clearly apparent from the following detailed description with respect to preferred embodiments of the invention when read in conjunction with the accompanying drawings, in which like parts are designated by like reference characters.

BRIEF DESCRIPTION OF THE DRAWINGS

In the drawings:

FIGS. 7(*d*), 7(*e*), and 7(*f*) are graphical representations indicating related frequency spectrums;

FIGS. 11(*d*) and 11(*e*) are graphical representations indicating related frequency spectrums;

FIGS. 15(*d*), 15(*e*), and 15(*f*) are graphical representations indicating related frequency spectrums;

DETAILED DESCRIPTION

Figure 1:
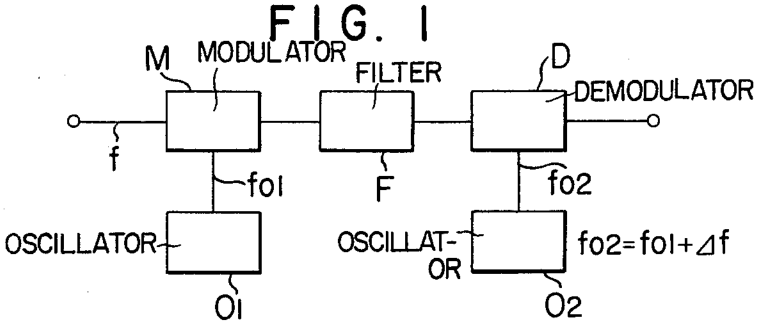
FIG. 1 is a block diagram indicating a known frequency-deviation method.
Figure 2:
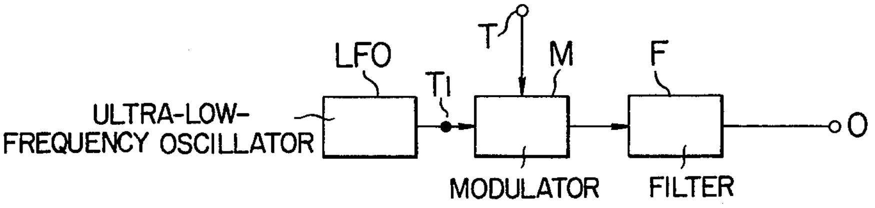
FIG. 2 is a block diagram indicating one example of embodiment of the invention.

Referring to FIG. 2, there is indicated a frequency-deviation circuit according to the present invention wherein an output signal of an ultra-low-frequency (sub-audio-frequency) $\Delta f$ of, for instance, from 1 to 10 Hz obtained from an ultra-low-frequency (sub-audio-frequency) oscillator LFO, is applied to an input terminal $T_1$ of an amplitude modulator M as a carrier wave (i.e. a signal to be modulated), and a modulating signal of, for instance, a musical-tone signal of a frequency $f$, which is far higher than that of the ultra-low-frequency oscillator LFO, is applied to an input terminal T (the terminal for a modulating signal) of the amplitude modulator M, whereby output signals having frequencies $f \pm \Delta f$ can be obtained.

Figure 3:
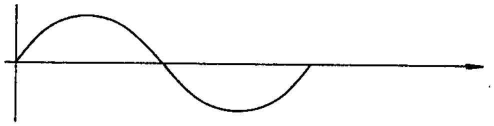
FIGS. 3(*a*) through 3(*e*), inclusive, are graphical representations indicating signal waveforms at various parts of the apparatus shown in FIG. 2 and a frequency spectrum (FIG. 3(*d*)
Figure 3:
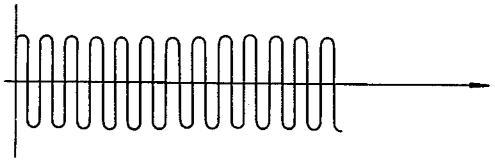
Figure 3:
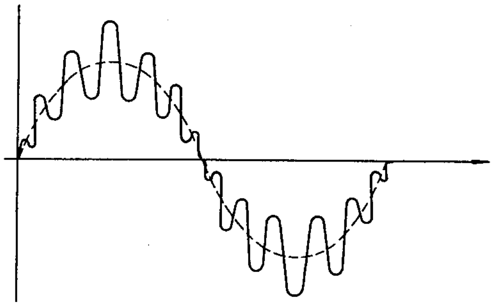
Figure 3:
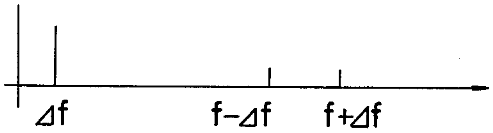
Figure 3:
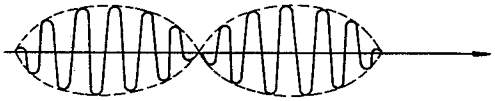

The operation of the circuit shown in FIG. 2 will now be considered analytically with reference specifically to the graphical representations of wave forms in FIG. 3. A carrier wave $$A \cos \Delta\omega\, t$$

(wherein $\Delta\omega = 2\,\pi\Delta f$) obtained from the ultra-low-frequency oscillator LFO and indicated in FIG. 3*a* is modulated with a modulating signal acos $\omega t$ (wherein $\omega = 2\,\pi f$) indicated in FIG. 3*b*, and a resultant amplitude-modulated wave representable by $$A \cos\Delta\omega t(1 + m \cos\omega t) = A \cos\Delta\omega t + \frac{mA}{2}\left\{\cos(\omega + \Delta\omega)t + \cos(\omega - \Delta\omega)t\right\}$$

can be obtained from the output terminal of the amplitude modulator M.

FIG. 3*c* shows the modulated output signal for the case of $m = 0.5$ (wherein $m = Ka$ represents a modulation factor, and K represents a modulation sensitivity). The frequency spectrum of this output signal is composed of three frequency components $\Delta f$, $f - \Delta f$, and $f + \Delta f$ as shown in FIG. 3*d*. When this output signal is passed through a high-pass filter F to cut-off the ultra-low-frequency component $\Delta f$, an output signal expressable by $$\frac{mA}{2}\left\{\cos(\omega + \Delta\omega)t + \cos(\omega - \Delta\omega)t\right\}$$

can be obtained at the output terminal O (see FIG. 3*e*).

From this result, it is apparent that two frequency components $f - \Delta f$ and $f + \Delta f$, which consist of the frequency $f$ of the tone signal deviated by $\Delta f$ on either of the upper and lower sides thereof, can be obtained from the output terminal O.

Figure 4:
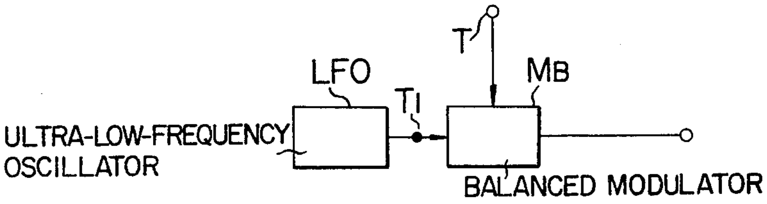
FIG. 4 is a block diagram indicating another example of embodiment of the invention.

Referring to FIG. 4, there is indicated another embodiment of the present invention, wherein a balanced modulator $M_B$ is employed instead of the amplitude modulator M of the previous example, the carrier being $\Delta f$ and the modulating signal being $f$. In this embodiment of the invention, output frequencies $f - \Delta f$ and $f + \Delta f$ can be obtained directly, and the filter F can be omitted.

More specifically, two of the amplitude-modulators M as described in the previous example are employed as the balanced modulator $M_B$. On one of the amplitude modulators, the carrier signal and the modulating signal, both of 0° phase angle are applied, and, on the other of the amplitude modulators, the carrier signal and the modulating signal, both of 180° phase angle, are applied. Thus, the two amplitude modulators are operated as described before. In this case, since the output frequency components $\Delta f$ from both of the amplitude-modulators are in opposite phase, the mixed resultant output signals include the frequency components $f - \Delta f$ and $f + \Delta f$ only.

Figure 5:
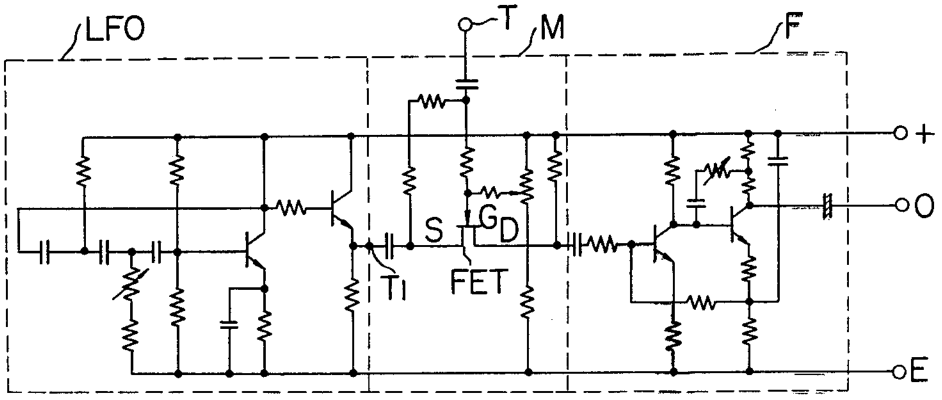
FIG. 5 is a circuit diagram showing one example of a specific circuit organization for the embodiment of the invention indicated in FIG. 2.

A practicable circuit constructed in accordance with the example of FIG. 2 is shown in FIG. 5, wherein the ultra-low-frequency oscillator LFO consists of an RC-Oscillator which can be easily oscillated in the ultra-low-frequency range of from 1 to 10 Hz. In the modulation stage M of the circuit, a field-effect transistor FET is employed, and by the application of a modulating signal to the gate G and a carrier signal to be modulated to the source electrode S of the transistor, an amplitude-modulated output signal can be obtained at the drain electrode D of the transistor FET.

In this circuit, since wide differences exist between the frequencies $f \pm \Delta f$ and the carrier frequency $\Delta f$, the organization of a filter to cut-off the frequency $\Delta f$ can be extremely simple, and accurate filtering of the frequency can be easily realized.

Figure 6:
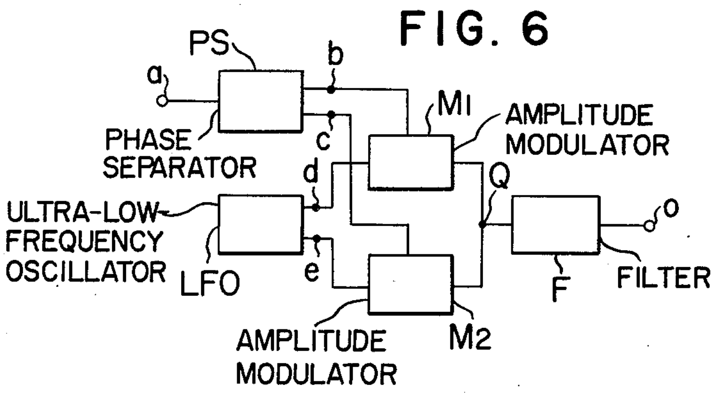
FIG. 6 is a block diagram indicating still another example of embodiment of the invention.

FIG. 6 shows a frequency deviation circuit constituting still another embodiment of the invention. In this circuit, there are employed an ultra-low-frequency (sub-audio frequency) oscillator LFO, a phase separator PS, amplitude modulators $M_1$ and $M_2$, and a filter F. The ultra-low-frequency oscillator LFO employed in this circuit is of a type delivering two output signals as carriers to be modulated having a mutual 90° phase difference (in this case, one signal being considered to have a 0° phase angle and the other signal to have a −90° phase angle). Likewise, the phase separator PS can divide a modulating signal applied to the input terminal *a* thereof into two output modulating signals having a mutual 90° phase difference (in this case, signals of 0° and −90° phase angles being considered).

With the above described organization of the circuit, the modulating signals obtained from the output terminals *b* and *c* of the phase separator PS are provided with phase angles of 0° and −90°, and also the phase angles of the carrier signals to be modulated obtained at the output terminals *d* and *e* of the ultra-low-frequency oscillator LFO are 0° and −90° respectively. Accordingly, the amplitude modulator $M_1$ amplitude-modulates the carrier signal from the LFO having a phase angle 0° with a modulating signal having 0° phase angle from the phase separator PS, and the amplitude modulator $M_2$ amplitude-modulates another carrier signal from the LFO having −90° phase angle with another modulating signal having −90° phase angle from the phase separator PS.

Thus, if it is assumed that the modulating signals from the terminal *b* and *c* can be expressed as $a\cos \omega t$ and $a\sin \omega t$ (wherein $\omega = 2\pi f$), respectively, and that the carrier signals to be modulated obtained from the terminals *d* and *e* can be expressed as $A \cos \Delta\omega t$ and $A \sin \Delta\omega t$ (wherein $\Delta\omega\ 2\pi\Delta f$), respectively, output signals from the amplitude modulators $M_1$ and $M_2$ can be expressed as follows.

$$= A \cos\Delta\omega t + \frac{mA}{2}\cos(\omega + \Delta\omega)t + \frac{mA}{2}\cos(\omega - \Delta\omega)t$$

Output signal from $M_2 = A \sin\Delta\omega t)| + m \sin\omega t)$ $$= A \sin\Delta\omega t - \frac{mA}{2}\cos(\omega + \Delta\omega)t + \frac{mA}{2}\cos)\omega - \Delta\omega)t$$

wherein, $m = Ka$ is a modulating factor.

These two output signals are added together at a circuit point Q, and a resultant output signal expressable by $$A\ (\cos \Delta\omega t + \sin \Delta\omega t) + mA \cos (\omega - \Delta\omega)t$$

, is obtained. This output signal is then passed through a filter F, so that the $\Delta f$ frequency component is cut-off, whereby a resultant output signal $mA\cos(\omega - \Delta\omega)t$ can be obtained from the output terminal O.

Figure 7A:
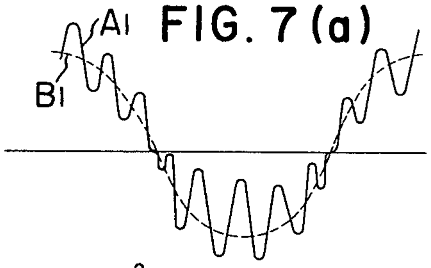
FIGS. 7(*a*), 7(*b*), and 7(*c*) are graphical representations indicating signal waveforms at parts of the apparatus indicated in FIG. 6.
Figure 7D:
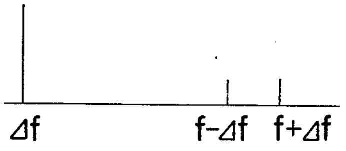
Figure 7B:
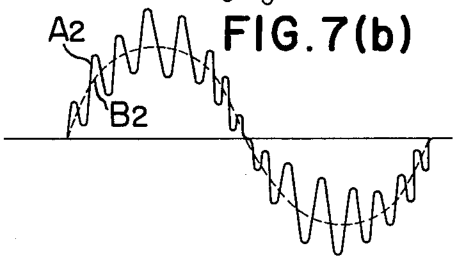
Figure 7E:
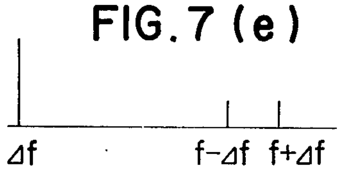
Figure 7C:
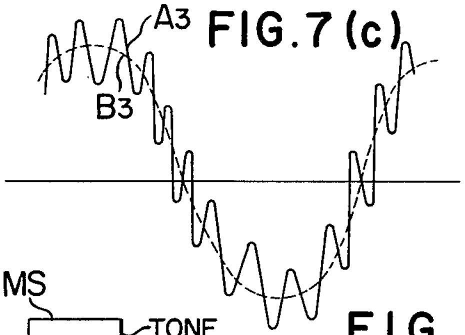

FIGS. 7*a*, 7*b* and 7*c* graphically represent these relations more clearly. In these representations, FIG. 7*a* shows the output waveform of the amplitude modulator $M_1$ wherein $A_1$ represents a resultant modulated signal which is obtained by amplitude-modulating a carrier signal $B_1$ from the terminal *d* by a modulating signal from the terminal *b*. The frequency spectrum of the output signal from the modulator $M_1$ includes three frequency components $f$, $f - \Delta f$, and $f + \Delta f$ as clearly shown in FIG. 7*d*.

Likewise, FIG. 7*b* shows the output waveform of the amplitude-modulator $M_2$ wherein $A_2$ represents a resultant modulated signal which is obtained by amplitude-modulating a carrier signal $B_2$ from the terminal *e* by a modulating signal from the terminal *c*. The frequency spectrum of the output signal from the modulator $M_2$ also includes three frequency components $\Delta f$, $f - \Delta f$, and $f + \Delta f$ as shown in FIG. 7*e*. Of these frequency components shown in FIGS. 7*d* and 7*e*, the components having a frequency $f - \Delta f$ are in the same phase relation, and the components having a frequency $f - \Delta f$ are in the opposite phase relation.

Figure 7F:
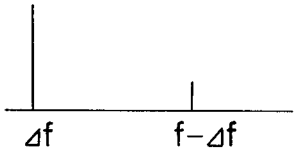

Accordingly, if the two output signals from the amplitude-modulators $M_1$ and $M_2$ are added together at the circuit point Q, the two components having a frequency $f + \Delta f$ are mutually cancelled, and the frequency components having $f$ and $f - \Delta f$ are obtained as shown in the frequency spectrum of FIG. 7*f*. FIG. 7*c* indicates the fact that the resultant output signal consists of a component having a frequency $f - \Delta f$ and designated by $A_3$, and another component having a frequency $\Delta f$ and designated by $B_3$. Accordingly, when the resultant output signal is passed through a filter F, and the frequency component of $\Delta f$ is removed, the component having a frequency of $f - \Delta f$ is obtained from the output terminal of the filter F.

Although in the above description of the example shown in FIG. 6, the circuit has been described as obtaining an output signal having a frequency of $f - \Delta f$, which is lower than the modulating frequency f of the tone signal by a frequency deviation amount of $\Delta f$, it will be apparent to those skilled in the art that a frequency higher than the tone signal frequency $f$ by the frequency deviation $\Delta f$ can also be obtained when either one of the modulating signal and the carrier signal is applied to the amplitude-modulator with a reversed phase as compared with the above-mentioned case.

Figure 8:
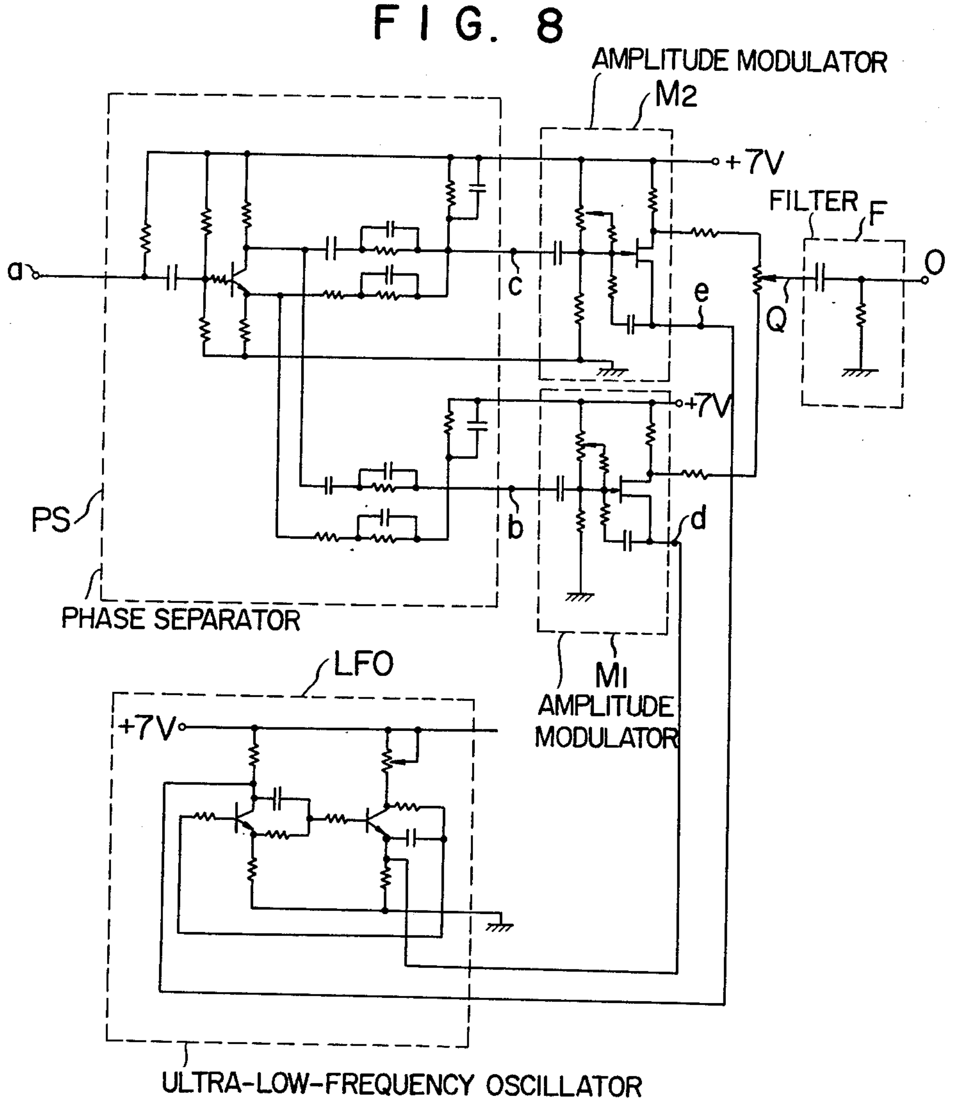
FIG. 8 is a circuit diagram indicating one example of a specific circuit organization for the embodiment of the invention indicated in FIG. 6.

FIG. 8 illustrates a more detailed practicable circuit of the embodiment of the invention shown in FIG. 6, wherein like members or components are designated by like reference numerals or characters. In the circuit shown in FIG. 8, there is provided a phase separator PS which divides the input signal into two output signals having phase angles separated from each other by a predetermined phase angle. That is, the phase angles of the output signals obtained from the terminals *b* and *c* are maintained different by an angle of 90°.

Figure 9:
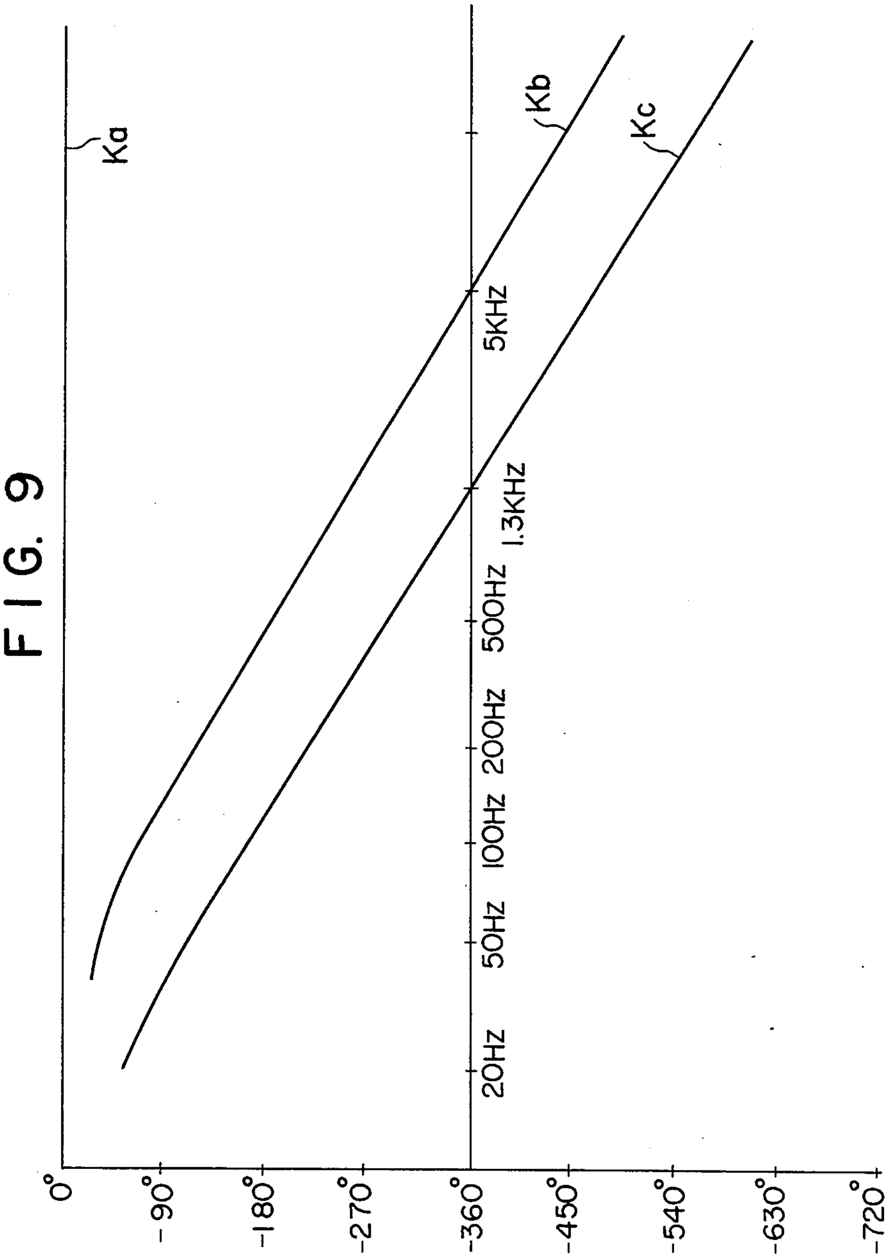
FIG. 9 is a graphical representation indicating phase characteristics of the phase separator circuit indicated in FIG. 6.

In FIG. 9, phase relations of various output signals in the circuit shown in FIG. 8 are represented, the input signal being taken as a basis. More specifically, the phase angle of the input signal is represented by a base line Ka, and the phase angles of the output signals obtained from the terminals *b* and *c* are indicated by characteristic curves K*b* and K*c*. From the difference between these curves K*b* and K*c*, it is apparent that the phase difference between the two output signals is substantially maintained at 90° within a frequency range of from 20 Hz to 20 kHz.

Figure 10:
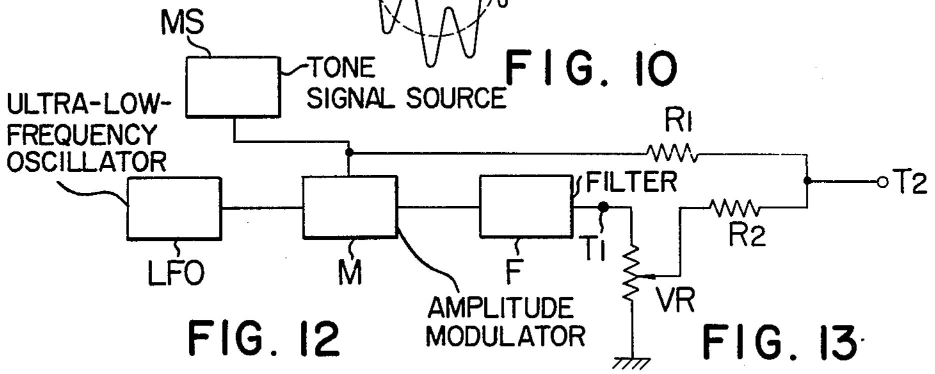
FIG. 10 is a schematic diagram, mostlly in block form, indicating one example of a tremolo effect generating device according to the invention.

FIG. 10 shows an example wherein the frequency deviation circuit shown in FIG. 2 is applied to a tremolo or chorus effect generating device. In the example shown in FIG. 10, there are provided a tone signal source MS of an electronic musical instrument, an ultra-low-frequency (sub-audio-frequency) oscillator LFO which can deliver an ultra-low frequency ranging, for instance, from 1 to 10 Hz, and an amplitude-modulator M which modulates the output signal from the ultra-low-frequency oscillator LFO with a tone signal delivered from the tone signal source MS of the musical instrument. The circuit further includes a high-pass filter F which cuts-off the ultra-low-frequency component included in the modulated signal, and mixing resistors VR, $R_1$ and $R_2$.

Figure 11:
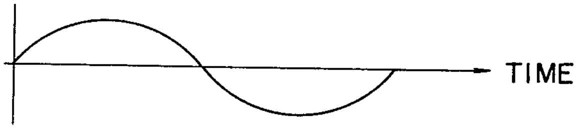
FIGS. 11(*a*), 11(*b*), 11(*c*), and 11(*f*) are graphical representations indicating signal waveforms at parts of the apparatus indicated in FIG. 1.
Figure 11:
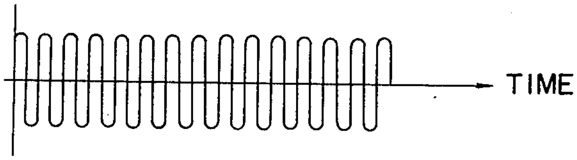
Figure 11:
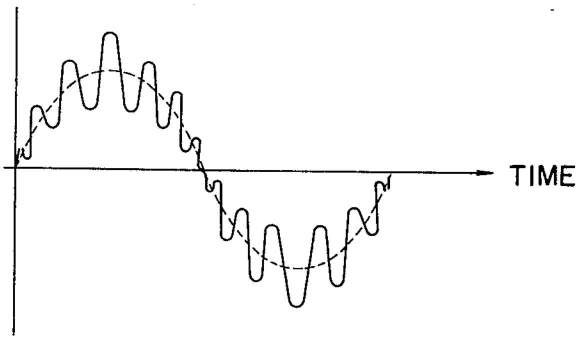
Figure 11:
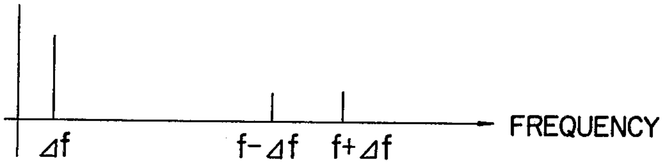
Figure 11:
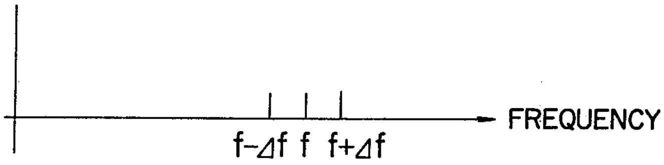
Figure 11:
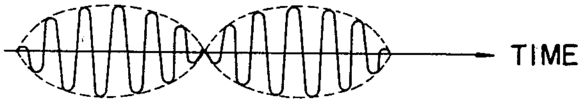

The operation of the circuit shown in FIG. 10 will now be described. It is assumed that the carrier signal to be modulated and delivered from the ultra-low-frequency oscillator LFO can be expressed as $A\cos\Delta\omega t$ ($\Delta\omega = 2\pi\omega f$), the waveform of which is shown in FIG. 11(*a*), and the musical tone signal of a modulating signal can be expressed as $a\cos\omega t$ ($\omega = 2\pi f$), the waveform of which is shown in FIG. 11(*b*). Then, at the output side of the amplitude-modulator M, an amplitude-modulated output signal as indicated below can be obtained.

$$A\cos\Delta\omega t(1 + m\cos\omega t) = A\cos\Delta\omega t + \frac{mA}{2}\left\{\cos(\omega + \Delta\omega)t + \cos(\omega - \Delta\omega)t\right\}$$

wherein $m = Ka$ is a modulation factor and $K$ is modulation sensitivity. The waveform of the output modulated signal in the case of $m = 0.5$ is shown in FIG. 11(*c*). The frequency spectrum for the output signal is indicated in FIG. 11(*d*) wherein three frequency components $\Delta f$, $f - \Delta f$, and $f + \Delta f$ are contained.

The output signal is thereafter passed through a high-pass filter F to cut the ultra-low-frequency component $\Delta f$, and a resultant signal $mA/2\{\cos(\omega + \Delta\omega)t + \cos(\omega - \Delta\omega)t\}$ is obtained from the output terminal $T_1$ of the filter F. In this case the resultant signal includes two frequency components deviated above and below the tone signal frequency $f$ by a deviation equal to the carrier ultra-low-frequency $\Delta f$. The resultant output signal is thereafter mixed with the original tone signal through a variable resistor VR and fixed resistors $R_1$ and $R_2$ so that an output signal consisting of the above mentioned two signals mixed together with a desired mixing ratio is obtained from the output terminal $T_2$. The mixed output signal (see FIGS. 11*e* and 11*f*) can be expressed in the form of $$a_1\cos(\omega t + \phi) + a_2\cos(\omega + \Delta\omega)t + \cos(\omega - \Delta\omega)t$$

wherein $a_1$ and $a_2$ are the amplitudes of the two signals, and $\phi$ is the phase difference between the input signal and the output signal of the filter F.

This output signal is then passed through a suitable amplifier and an expression circuit (not shown) to a loudspeaker (not shown), and sound accompanied by a tremolo or chorus effect, wherein not only the amplitude of the sound but also the frequencies thereof are deviated, can be obtained. The tremolo effect is obtained when the ultra-low-frequency $\Delta f$ is selected in a range of 5 to 7 Hz, and the chorus effect is obtained when the same frequency is selected in a range of 0.5 to 2 Hz.

Figure 12:
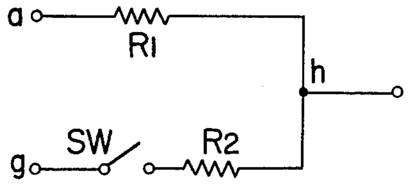
FIGS. 12 and 13 are connection diagrams indicating modifications of the mixing circuit indicated in FIG. 10.
Figure 13:
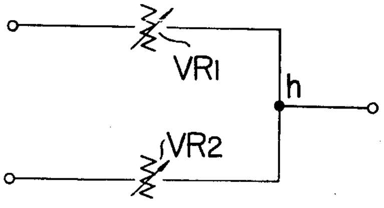

The above described mixing circuit, wherein the output signal from the filter F and the original tone signal are mixed together can be realized in various ways other than in the above described circuit organization including a variable resistor and two fixed resistors. For instance, a switch SW may be provided as shown in FIG. 12 at the output side of the filter F, whereby selective switching between the pure tone signal and the tone signal with tremolo or chorus effect can be carried out. As another example, two variable resistors $VR_1$ and $VR_2$ may be provided in respective channels of the two signals, as indicated in FIG. 13, so that the mixing ratio of the two signals can be varied more effectively.

Furthermore, the tremolo or chorus effect rendering device according to the present invention can be adapted to be combined in any type of electronic musical instrument. For instance when the electronic musical instrument is of a type having upper and lower keyboards, the device may be incorporated with either one of the keyboards. Since the tremolo or chorus effect rendering device is of a fully electrical organization, it can be produced without requiring any-high-precision mechanical technique.

Figure 14:
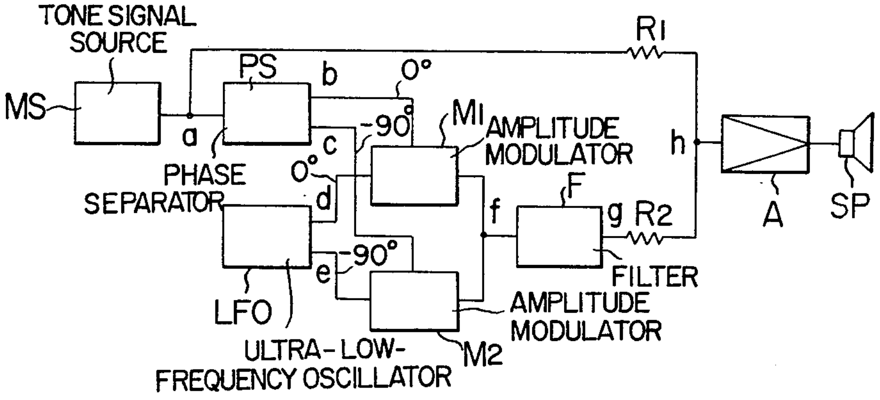
FIG. 14 is a schematic diagram, mostly in block form, indicating another example of a tremolo effect generating device according to the invention.

In FIG. 14, there is indicated another application of the frequency-deviation circuit according to the present invention. In this application, there are provided a tone signal source MS, a phase-separating circuit PS which supplies two output signals at its terminals *b* and *c*, these signals having 90° mutual phase difference when a tone signal is applied at the input terminal *a*, and a two-phase ultra-low-frequency oscillator LFO which generates two signals of, for instance, from 1 to 10 Hz having a 90° mutual phase difference from the terminals *d* and *e*.

The circuit further has amplitude-modulators $M_1$ and $M_2$ which modulate two carrier signals of a ultra-low frequency obtained from the terminals *d* and *e* with two musical tone signals obtained from the terminals *b* and *c* of the phase-separating circuit PS, respectively. A high-pass filter F is used to cut off the ultra-low-frequency component included in the resultant mixed output signal. The circuit is further provided with mixing resistors $R_1$ and $R_2$, an amplifier A, and a speaker SP.

It is assumed that the phase angle of the musical tone signal obtained from the terminal *c* of the phase-separating circuit PS is lagging by 90° from that of the other musical tone signal obtained from the terminal *b* of the same PS circuit, and also that the phase angle of a signal to be modulated obtained from the output terminal *e* of the ultra-low-frequency oscillator LFO is lagging by 90° from that of the terminal *d* of the same oscillator. Then the signals obtained from the terminals *b*, *c*, *d* and *e* can be expressed, respectively, as $a \cos \omega t \ (\omega = 2\pi f)$, $a \sin \omega t \ (\omega = 2\pi f)$, $A \cos \Delta\omega t \ (\Delta\omega = 2\pi\Delta f)$, and $A \sin \Delta\omega t \ (\Delta\omega = 2\pi\Delta f)$.

As a result, when the signal obtained from the terminal *d* is amplitude-modulated in the amplitude modulator $M_1$ with a tone signal from the terminal *b*, the output signal obtained from the amplitude modulator $M_1$ can be expressed as follows.

$$\text{Output from } M_1 = A \cos\Delta\omega t(1 + m \cos\omega t)$$
$$= A \cos\Delta\omega t + \frac{mA}{2}\cos(\omega + \Delta\omega)t + \frac{mA}{2}\cos(\omega - \Delta\omega)t$$

wherein, $m = Ka$ is a modulation factor (in which K is a modulation sensitivity).

Likewise, when the signal obtained from the terminal *e* is amplitude-modulated in the other amplitude modulator $M_2$ with another tone signal from the terminal *c*, the output signal obtained from the modulator $M_2$ can be expressed as $$\text{Output from } M_2 = A \sin\Delta\omega t(1 + m \sin\omega t)$$
$$= A \sin\Delta\omega t - \frac{mA}{2}\cos(\omega + \Delta\omega)t + \frac{mA}{2}\cos(\omega - \Delta\omega)t$$

wherein, $m = Ka$ is the modulation factor (in which K is modulation sensitivity).

The output signals from the modulators $M_1$ and $M_2$ are then added together at a point *f*, whereupon a resultant signal $$A\{\cos \Delta\omega t + \sin \Delta\omega t\} + mA \cos(\omega - \Delta\omega)t$$

is obtained. This resultant signal is passed through the filter F for removing the frequency component $\Delta f$, whereby an output signal $mA \cos(\omega - \Delta\omega)t$ is obtained from the output terminal *g* of the filter F. The frequency of this signal is lower than that of the tone signal delivered from the terminal *a* of the tone source MS by an frequency $\Delta f$. That is, the output frequency obtained from the filter F is lower than that of the tone signal by a decrement equal to the frequency $\Delta f$ of the ultra-low-frequency oscillator LFO (called the lower side-band signal).

Figure 15:
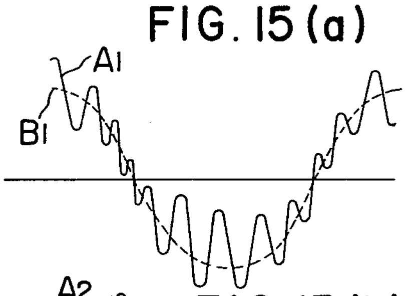
FIGS. 15(*a*), 15(*b*), and 15(*c*) are graphical representations indicating signal waveforms at parts of the circuit indicated in FIG. 14.
Figure 15:
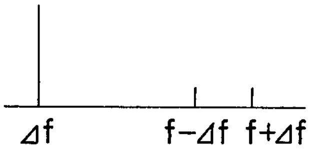
Figure 15:
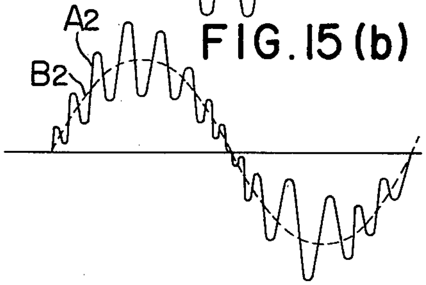
Figure 15:
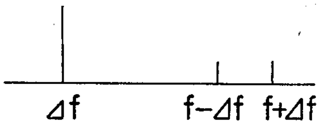
Figure 15:
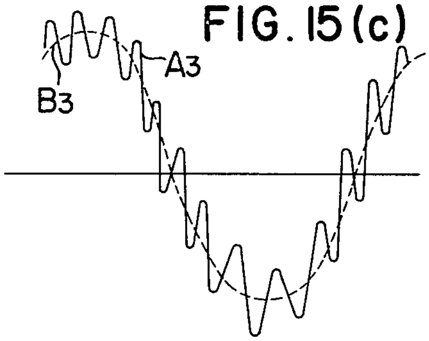
Figure 15:
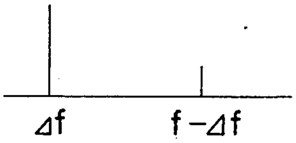

FIGS. 15(*a*) through 15(*f*) represent waveforms and frequency spectrums at various points of the circuit, wherein FIG. 15(*a*) shows the output waveform of the amplitude modulator $M_1$, which includes a tone-signal component $A_1$ obtained from the terminal *b* and an ultra-low-frequency component $B_1$ obtained from the terminal *d*. FIG. 15(*b*) indicates the output waveform of the amplitude modulator $M_2$, which includes another tone-signal component $A_2$ obtained from the terminal *c* and another ultra-low-frequency component $B_2$ obtained from the terminal *e*.

FIG. 15(*c*) indicates a resultant output signal obtained by adding together the outputs from the amplitude modulators $M_1$ and $M_2$. The frequency spectrums for the output signals from the amplitude modulators $M_1$ and $M_2$ are shown in FIGS. 15(*d*) and 15(*e*), and although the two frequency spectrums seem to be quite alike, the phase relations for the frequency $f + \Delta f$ in the two frequency spectrums are opposite. Accordingly, when these two output signals are added together, the resultant frequency spectrum shown in FIG. 15(*f*) includes only two frequency components $\Delta f$ and $f - \Delta f$, and when the frequency component $\Delta f$ is removed by the filter F, only the frequency component $f - \Delta f$ remains.

In this example circuit, the connections to the terminals *b* and *c* for the musical-tone signals led to the amplitude modulators $M_1$ and $M_2$, respectively, are mutually exchanged, or the connections to the terminals *d* and *e* of the ultra-low-frequency signals led to the amplitude modulators $M_1$ and $M_2$ are mutually interchanged, whereby an output signal including another frequency component $f + \Delta f$ (upper side band) can be obtained from the output terminal of the filter F.

When either one of these output signals obtained from the output terminal of the filter F, which are hereinafter called frequency-deviated signals, is mixed with the tone signal obtained from the terminal *a* through mixing resistors $R_1$ and $R_2$, a resultant signal which can be expressed by $a_1\cos(\omega t + \phi) + a_2\cos(\omega \pm \Delta\omega)t$ is obtained at the terminal *h*, wherein $\phi$ is the phase difference between the signal from the terminal *a* and the signal from the terminal *b*.

It will be apparent the the resultant signal is a signal which is amplitude-modulated and phase modulated simultaneously with the same ultra-low frequency $\Delta f$, and with this signal thereafter passed through an amplifier A to the loudspeaker SP, a tremolo or chorus effect equal to that obtained by rotating a loudspeaker can be obtained. In other words, the above described organization of the circuit may be considered to be an arrangement having two separate groups of tone sources, the frequencies of which are deviated by an ultra-low frequency generated from an ultra-low-frequency oscillator LFO, and for the reason, a resultant sound of extreme richness can be obtained.

Figure 16:
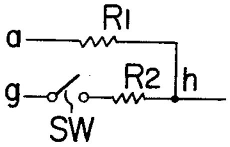
FIGS. 16, 17, and 18 are connection diagrams indicating various modifications of the mixing circuit indicated in FIG. 14.
Figure 17:
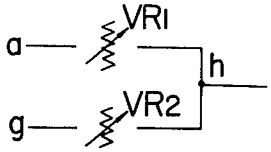
Figure 18:
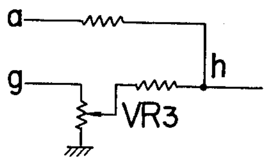

The above described mixing circuit between the frequency-deviated tone signals from the filter F and the original tone signals may have various forms. For instance, the circuit may be formed as shown in FIG. 16 including a switch SW on the output side of the filter F. The switch SW is operated selectively for changing over the circuit connection for transmitting the original tone signals only and for transmitting the mixed signals for rendering the tremolo or chorus effect sounds. Alternatively, the circuit may also be formed as shown in FIG. 17, wherein variable resistors $VR_1$ and $VR_2$ are provided in the paths of the two component signals, respectively, whereby the mixing ratio of the two component signals can be adjusted more closely. As another example, the mixing circuit may be otherwise constructed as shown in FIG. 18 wherein a variable resistor $VR_3$ is employed on the output side of the filter F. In each of the above described cases, the mixing ratio between the two component signals is selected to be near 1, that is the output level of the original tone signals is made substantially equal to the output level of the filter F, or either one of the two output level is selected to be slightly lower than the other.

Furthermore, the above described phase differences, between the two output tone signals from the phase-separating circuit PS and between the two output signals from the ultra-low-frequency oscillator LFO, may also be selected to correspond to phase angles other than the above described 90° phase differences. In this case, a better result can be obtained because of the creation of an amplitude variation in the frequency-deviated tone signals.

Figure 19:
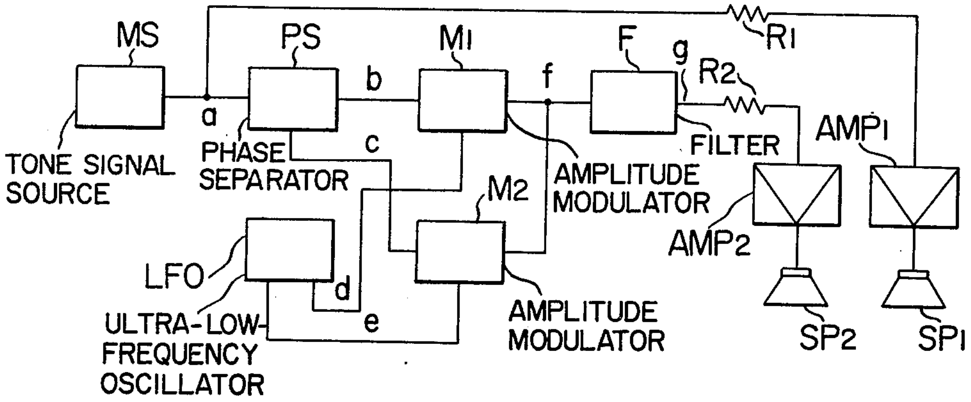
FIG. 19 is a schematic diagram, mostly in block form, indicating still another example of a tremolo effect generating device according to the invention.

FIG. 19 shows another circuit for producing tremolo or chorus effects employing the same frequency-deviation circuit as in the example shown in FIG. 14. As in the previous example, there is provided a tone signal cource MS, a phase-separating circuit PS producing two output signals having a 90° mutual phase difference between each other at the terminals *b* and *c*, and a two-phase, ultra-low-frequency oscillator LFO which generates two signals of, for instance, from 1 to 10 Hz having a 90° mutual phase difference from the terminals *d* and *e*. The circuit further has amplitude-modulators $M_1$ and $M_2$ which modulate two signals from the terminals *d* and *e* of the ultra-low-frequency oscillator LFO with two musical-tone signals obtained from the terminals *b* and *c* of the phase-separating circuit PS, respectively. A high-pass filter F for cutting the ultra-low-frequency component generated from the ultra-low-frequency generator LFO is provided. As shown, mixing resistors $R_1$ and $R_2$, amplifiers $AMP_1$ and $AMP_2$, and loud-speakers $SP_1$ and $SP_2$ are provided.

In this case also, a tone signal (a lower side-band signal) of a frequency lower than that of the tone signal generated from the tone signal source MS by a frequency generated from the ultra-low-frequency oscillator LFO can be obtained.

As in the example shown in FIG. 14, when the lead wires connected to the terminals *b* and *c* of the phase-separating circuit PS are mutually interchanged, or when the lead wires connected to the terminals *d* and *e* of the ultra-low-frequency oscillator LFO are mutually interchanged, a tone signal of a frequency higher than the tone signal generated from the tone signal source MS by a frequency $\Delta f$ obtained from the ultra-low frequency oscillator LFO (a higher side-band signal) can be obtained at the output terminal of the filter F.

The above described frequency-deviated output signal from the filter F (hereinafter called a frequency-deviated signal) and a musical-tone signal from the terminal *a* of the musical-tone source MS are passed through the resistors $R_2$ and $R_1$, respectively, for suitably adjusting the signal levels, and the resultant signals are passed through the amplifier $AMP_2$ and $AMP_1$ to the speakers $SP_2$ and $SP_1$, respectively. As a result, the output sounds from the loudspeakers $SP_2$ and $SP_1$, added spatially together, can be expressed as $a_1\cos(\omega t + \phi) + a_2\cos(\omega - \Delta\omega)t$, where $a_1$ and $a_2$ are constants representing amplitudes of the signals, and $\phi$ is the phase difference between the two signals obtained from the terminals *a* and *b*.

Although the above described formula represents a combination of an amplitude-modulated signal with a frequency $\Delta f$ and a phase-modulated signal with the same frequency $\Delta f$, the sound thus spatially synthesized are more complicated because of the introduction of spatial forces such as the loudspeaker characteristics, locations of the loudspeakers, reflections of the sounds, and the transmission speed of the sounds in the listening room. For this reason, the sound thus obtained will be more natural and rich than those delivered from the example shown in FIG. 14, where the tone signals are electrically mixed together and thereafter reproduced into sound, whereby the wide-spread sensation of sound obtained from rotating loudspeakers can be simulated more precisely.

Figure 20:
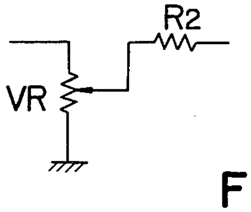
FIGS. 20 and 21 are connection diagrams indicating different examples of the part for controlling the signal from the filter F to the amplifier $AMP_2$ of the circuit shown in FIG. 19.
Figure 21:
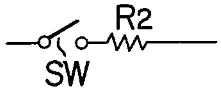

Level adjustments of the musical-tone signals applied to the amplifiers $AMP_1$ and of the frequency-deviated tone signals applied to the amplifier $AMP_2$ may be carried out by means of a variable resistor VR provided in the circuit of the frequency-deviated signal, as indicated in FIG. 20, or may be carried out through gain-control elements included in the amplifiers themselves. If required, a switch SW may be provided in the path of the frequency-deviated signal as shown in FIG. 21 so that the circuit may be selectively switched between the ordinary musical tone and the tremolo or chorus effect. Furthermore, in this case also, if the phase differences, between the two output signals of the phase-separating circuit and also between the two output signals of the two-phase ultra-low-frequency oscillator LFO, are not exactly 90° but are slightly deviated therefrom, an amplitude variation is caused in the frequency-deviated signal, and a far better result can be thereby obtained.

Figure 22:
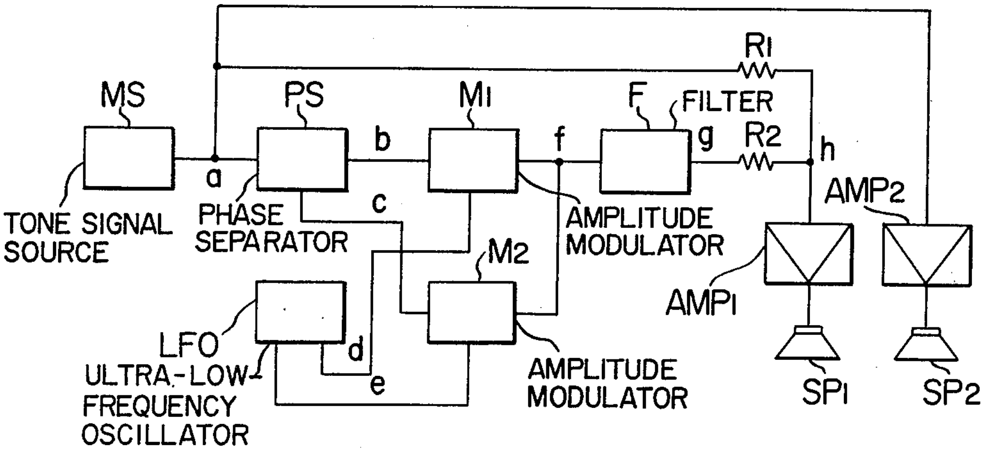
FIG. 22 is a schematic diagram, mostly in block form, indicating a further example of a tremolo effect generating device according to the invention.

Still another example of the circuit for producing tremolo or chorus effects according to the invention is indicated in FIG. 22. In this example, all of the circuit components equivalent to those in the example shown in FIG. 19 are designated by like characters or symbols, and the only differences between this example and the previous example shown in FIG. 19 are that the musical-tone signals obtained from the tone-signal source MS is applied directly to the input terminal of the amplifier $AMP_2$, the output of which is connected to the loudspeaker $SP_2$, and that mixed signals from the tone-signal source MS and from the filter F, mixed through the resistors $R_1$ and $R_2$, are applied to the input terminal of the amplifier $AMP_1$, the output of which is connected to the loudspeaker $SP_1$.

With this organization of the circuit shown in FIG. 22, similar frequency-deviated signals, having a frequency lower than the frequency $f$ of the original tone signal by a deviation frequency $\Delta f$, can be obtained from the output terminal of the filter F. However, as described before with respect to the examples shown in FIGS. 14 and 19, when the connections of the lead wires connected to the output terminals $b$ and $c$ of the phase-splitting circuit PS are mutually interchanged, or when the connections of the lead wires connected to the output terminals $d$ and $e$ of the ultra-low-frequency oscillator LFO are mutually interchanged, a musical-tone signal of a frequency higher than that of the tone signal by a frequency $\Delta f$ obtained from the ultra-low-frequency oscillator LFO (a higher side-band signal) can be obtained at the output terminal of the filter F.

The output signal from the filter F and the original musical-tone signal are mixed together with the signal levels adjusted by means of mixing resistors $R_2$ and $R_1$, respectively. The resultant mixed signal thus obtained at a position $h$ in the circuit can be expressed as $$a_1\cos(\omega t + \phi) + a_2\cos(\omega - \Delta\omega)t$$

wherein, $a_1$ and $a_2$ are amplitudes of the sinusoidal waves, and $\phi$ is the phase difference between the two signals obtained from the output terminals $a$ and $g$. Thus it will be apparent that the resultant mixed signal includes a component amplitude modulated with a frequency $\Delta f$ (angular velocity $\Delta\omega$) obtained from the ultra-low-frequency oscillator LFO and another component phase-modulated with the same frequency $\Delta f$.

The resultant mixed signal and the original tone signal from the terminal $a$ are supplied respectively through amplifiers $AMP_1$ and $AMP_2$ to the loudspeakers $SP_1$ and $SP_2$, and the reproduced sounds therefrom are synthesized spatially in the listening room.

In this case, spatial elements such as the characteristics, locations, phase relations, reflection features and transmission speed of the sound alter the nature of the sound, whereby sounds of more natural, rich, and wide-spreading audible sensation than those synthesized electrically can be obtained. Such sounds can simulate the tremolo or chorus effect sound produced from a loudspeaker rotated about a vertical axis. In other words, the tremolo or chorus effect rendering circuit of this example can be considered to be a system including two series of tone sources, the frequencies of which are deviated from each other by an oscillation frequency $\Delta f$ obtained from an ultra-low-frequency oscillator.

Figure 23:
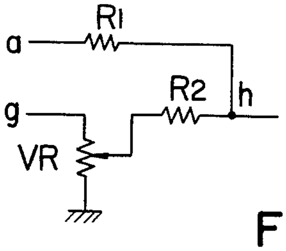
FIGS. 23 and 24 are connection diagrams indicating different examples of the mixing circuit for mixing deviation musical-tone signals from the filter F in the circuit shown in FIG. 22 and the original musical-tone signals.
Figure 24:
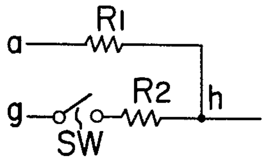

The signal levels of the musical-tone signal and the frequency-deviated signal, both mixed together on the input side of the amplifier $AMP_1$, may be adjusted by means of a variable resistor VR inserted in the path of the frequency-deviated tone signal, as shown in FIG. 23, or may be adjusted by means of a switch SW also inserted in the same passage of the frequency-deviated tone signal, as shown in FIG. 24. Alternatively, the amplifiers $AMP_1$ and $AMP_2$ may be so organized as to include volume controls therewithin, whereby the level adjustments of both the synthesized signal at a circuit position $h$ and the musical-tone obtained from the terminal $a$ can be carried out more effectively than those described in the previous examples.

In addition, a better result may be obtained if the phase difference between two musical-tone signals delivered from the phase-separating circuit and also the phase difference between the two ultra-low-frequency signals obtained from the ultra-low-frequency oscillator are slightly deviated from the above described 90°, because the amplitude of the frequency-deviated musical-tone signal obtained in that case can be varied in addition to that of the frequency deviation.

Figure 25:
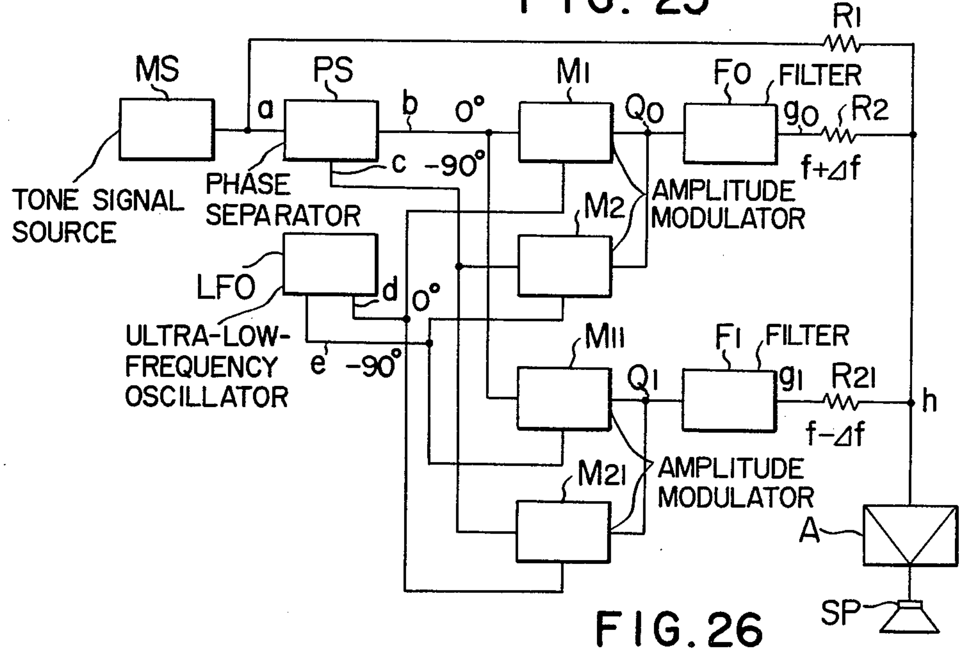
FIG. 25 is schematic diagram, mostly in block form, indicating a still further example of a tremolo effect generating device according to the invention.

In FIG. 25, thre is shown still another example of the tremolo or chorus effect producing circuit having a musical-tone-signal source MS; a phase-separating circuit PS which, upon reception of a musical-tone signal, delivers two output signals having a phase difference of approximately 90° therebetween from the output terminals $b$ and $c$; and an ultra-low-frequency oscillator LFO, which delivers two output signals of a frequency (for instance, from 0.5 to 7 Hz) amply lower than that of the musical-tone signal, the phase-difference of the two output signals being approximately 90°.

The circuit further includes for amplitude-modulators $M_1$, $M_2$, $M_{11}$, and $M_{21}$ which amplitude-modulate ultra-low-frequency signals from the output terminals $d$ and $e$ with musical-tone signals from the output terminals $b$ and $c$, high-pass filters $F_0$ and $F_1$ which cut-off the ultra-low-frequency component obtained from the ultra-low-frequency oscillator LFO included in the mixed output signals from the amplitude modulator pairs $M_1$ and $M_2$, and $M_{11}$ and $M_{21}$, mixing resistors $R_1$, $R_2$ amd $R_{21}$, an amplifier A, and a loudspeaker SP.

In this embodiment of the invention, a frequency-deviated musical-tone signal of a frequency $f - \Delta f$ (a lower side-band signal) can be obtained from the output terminal of the filter $F_0$. Since the signals from the ultra-low-frequency oscillator LFO applied to the amplitude-modulator pair $M_{11}$ and $M_{21}$ are in a reversed phase relationship with respect to the signals delivered from the same ultra-low-frequency oscillator LFO and applied to the above described amplitude-modulator pair $M_1$ and $M_2$, a frequency-deviated musical-tone signal of a frequency $f + \Delta f$ (an upper side-band signal) can be obtained from the output terminal of the filter $F_1$.

When the original musical-tone signal from the terminal $a$ and the above described two frequency-deviated signals delivered from the output terminals of the filters $F_0$ and $F_1$ are mixed together through mixing resistors $R_1$ and $R_2$ and $R_{21}$, the resultant signal obtained from a circuit position h can be expressed as $$a_1\cos\omega t + a_2\cos\{(\omega - \Delta\omega)t + \phi_2\} + a_3\cos\{(\omega + \Delta\omega)t + \phi_3\}$$

wherein, $a_1$, $a_2$ and $a_3$ represent amplitudes, and $\phi_2$ and $\phi_3$ are phase differences between the musical-tone signals obtained from the terminals $a$ and $b$, and also between those from the terminals $a$ and $c$, respectively.

Accordingly, the resultant signal includes a component signal amplitude modulated with the frequency of $\Delta f$ which has approximately twice the amplitude in the case of the previous example and another component signal phase modulated with the same ultra-low-frequency signal. As a result, the output sound from the loudspeaker is considered to be obtained from a tone source system having three separate groups of tone sources, and a tremolo or chorus effect sound of rich and wide-spread sensation can be obtained.

Figure 26:
FIG. 26 is graphical representation indicating the frequency spectrum of the output signal of the device indicated in FIG. 25.
Figure 27:
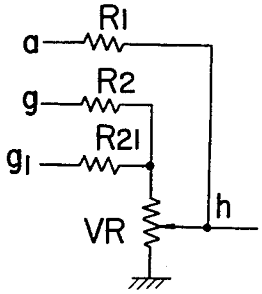
FIGS. 27 and 28 are connection diagrams indicating different modifications of the mixing circuit in the circuit indicated in FIG. 25.
Figure 28:
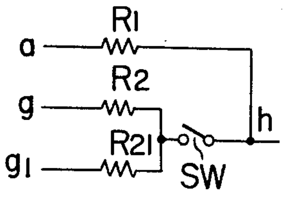

The frequency spectrum of the resultant signal obtained from the circuit position *h* includes the upper side-band signal of a frequency $f + \Delta f$ and the lower side-band signal of a frequency $f - \Delta f$, each included at different levels, as shown in FIG. 26. The mixing circuit consisting of the resistors $R_1$, $R_2$, and $R_{21}$, may alternatively be arranged as shown in FIG. 27, wherein a variable resistor VR is further connected with the resistors $R_2$ and $R_{21}$, or the circuit may be arranged as shown in FIG. 28, wherein a switch SW is provided at the output side of the resistor $R_2$ and $R_{21}$ so that a rendition of the musical-tone signal only or a rendition with tremolo or chorus effect can be selectively obtained.

I claim:

1. In a technique for producing tremolo effects with an electronic musical instrument, an improved frequency-deviation method for producing musical tones that are shifted in frequency by an amount $\Delta f$ both above and below a nominal tone frequency *f*, said method comprising the steps of:

a. generating a modulating signal of said frequency *f*;

b. generating a carrier signal of a frequency $\Delta f$, said frequency *f*; and c. amplitude modulating said lower frequency carrier signal with said higher frequency modulating signal to produce a resultant signal which is the product of said carrier signal and said modulating signal and is of the form $A(1 + M\cos wt)(\cos\Delta wt)$, A and M being constants, w being equal to $2\pi f$ and $\alpha w$ being equal to $2\pi\Delta f$, and which has a frequency spectrum consisting of $\Delta f$, $f - \Delta f$, and $f + \Delta f$ in order of increasisng frequency; and d. removing the carrier frequency component $\Delta f$ by passing said resultant signal through a low-pass filter, whereby a modulated output signal is produced having only the frequency component $f - \Delta f$ and the frequency component $f + \Delta f$.

2. A frequency-deviation apparatus comprising: phase separator means for receiving a signal and for supplying two modulating signals mutually having a 90° phase difference therefrom; an ultra-low-frequency oscillator means for generating two carrier signals to be modulated mutually having a 90° phase difference and having a frequency $\Delta f$ which is much lower than that of said modulating signals; two amplitude modulator means for receiving as inputs selected combinations of the modulating signals and carrier signals to be modulated to produce respective output signals each of a frequency deviated from the frequency of the corresponding modulating signal by an increment $\pm\Delta f$ of an absolute value equal to the frequency of the corresponding carrier signal being produced by mixing the outputs of the two amplitude modulators, and means for mixing said output signals.

* * * * *